United States Patent [19]
Rubenchik

[11] Patent Number: 5,698,030
[45] Date of Patent: Dec. 16, 1997

[54] COMPACT DISC COATING AND HANDLING SYSTEM

[75] Inventor: Yuri Rubenchik, Newton, Mass.

[73] Assignee: Nobler Technologies, Inc., Stoughton, Mass.

[21] Appl. No.: 381,195

[22] Filed: Jan. 31, 1995

[51] Int. Cl.$^6$ .................................................. B05C 11/02
[52] U.S. Cl. .......................... 118/52; 118/500; 294/94; 294/82.28
[58] Field of Search ...................... 294/94, 82.28; 279/2.23; 82/150; 118/52, 500

[56] References Cited

U.S. PATENT DOCUMENTS

| | | | |
|---|---|---|---|
| 4,071,149 | 1/1978 | Deguchi | 214/6 P |
| 4,320,914 | 3/1982 | Simon | 294/88 |
| 4,498,165 | 2/1985 | Wilkinson, Jr. | 369/270 |
| 4,598,395 | 7/1986 | Smith | 369/100 |
| 5,069,155 | 12/1991 | Kunze-Concewitz | 118/52 |
| 5,275,424 | 1/1994 | Watanabe | 279/2.03 |
| 5,364,222 | 11/1994 | Akimoto et al. | 414/941 |
| 5,374,312 | 12/1994 | Hasebe et al. | 118/52 |

FOREIGN PATENT DOCUMENTS

| | | |
|---|---|---|
| 37 20525 | 12/1988 | Germany . |
| 42 03 913 | 8/1993 | Germany . |
| 6282885 | 10/1994 | Japan . |
| WO 90/00798 | 1/1990 | WIPO . |

*Primary Examiner*—Brenda A. Lamb
*Attorney, Agent, or Firm*—Wolf, Greenfield & Sacks, P.C.

[57] ABSTRACT

A compact disc coating apparatus includes a first station for dispensing a quantity of lacquer on the disc surface and for spinning the disc to distribute a coating of lacquer over the disc surface, a second station, and a transfer assembly. The transfer assembly includes a pickup head for loading the disc into the first station and a gripper for transferring the disc from the first station to the second station. The gripper includes a rotatable disc gripping mechanism which clamps the disc during spinning at the first station. As soon as the disc stops spinning, the gripper lifts the disc from the first station.

16 Claims, 5 Drawing Sheets

COMPACT DISC COATING AND HANDLING SYSTEM

FIELD OF THE INVENTION

This invention relates to systems and methods for applying a lacquer coating to compact discs and, more particularly, to a compact disc gripper for use in disc coating systems.

BACKGROUND OF THE INVENTION

Compact discs have become a standard medium for recording of audio and video information in digital format. The replication of compact discs involves molding of a raw disc, sputtering a metallic coating on the raw disc to form a metallized disc and applying a lacquer coating to the metallized disc. The raw disc is molded plastic having data pits which contain digital information. The metallic coating forms a reflective layer that allows a scanning laser beam to read the digital information from the compact disc (CD). The lacquer coating functions as a protective layer for the metallic coating and provides a smooth surface for printing.

The steps in the replication of compact discs are typically automated to the extent that is practical. The throughput in terms of compact discs processed per unit time is an important parameter in achieving efficient and low cost production. Thus, it is critical to design the processing equipment so that the processing time and the handling time (the time required to move discs into and out of processing stations) are as short as possible.

The coating process, known as spincoating, involves dispensing a quantity of lacquer onto the compact disc surface, spinning the disc at high speed to produce a thin coating of lacquer on the metallized disc, and curing the lacquer coating with ultraviolet radiation. Two basic types of spincoating systems are known. In a first system, known as a one bowl spincoater, the lacquer is dispensed onto the disc surface and the disc is spun at high speed to distribute the lacquer over the disc surface in a single process station, or bowl. This system is relatively simple, compact and low in cost. However, the one bowl spincoater has a relatively long process time because dispensing of lacquer and spinning are performed serially.

In a two bowl spincoater, lacquer is dispensed onto the disc surface in a first process station, or bowl, and disc spinning to distribute the lacquer is performed in a second process station, or bowl. A system of this type is disclosed in U.S. Pat. No. 5,069,155, issued Dec. 3, 1991 to Kunze-Concewitz et al. An advantage of the two bowl spincoater is that productivity is increased because dispensing of lacquer and spinning are performed simultaneously at different stations. However, the time required for transfer of the compact disc from the first station to the second station adds to the total process time and reduces throughput. Furthermore, the two bowl spincoater is more complicated, is larger and has higher cost than the one bowl spincoater.

U.S. Pat. No. 4,320,914, issued Mar. 23, 1982 to Simon, relates to a clamping-type holder for clamping test tubes. Balls are positioned in openings in a cylinder so that when a housing cylinder moves downward, the balls move radially to engage the test tube.

U.S. Pat. No. 4,071,149, issued Jan. 31, 1978 to Deguchi, discloses an apparatus for piling apertured articles in stacks for storage. A control member is installed at the lower end of a pipe member so that projectable members project outwardly through openings due to the frustoconical surface of the control member, thereby grasping an object.

All of the known prior art compact disc coating systems have one or more disadvantages, including relatively low throughput, complex construction and relatively high cost. It is desirable to provide methods and apparatus for coating compact discs that overcome one or more of these disadvantages.

SUMMARY OF THE INVENTION

According to a first aspect of the invention, a gripper for manipulating a disc having a center opening is provided. The gripper comprises a disc gripping mechanism for gripping a disc at its center opening and an actuator connected to the disc gripping mechanism for linearly moving the disc gripping mechanism along an axis of rotation between a retracted position and an extended position. The disc gripping mechanism is adapted for clamping the disc to a disc spinning chuck and for rotating with the disc during spinning thereof by The disc spinning chuck. The disc gripping mechanism is further adapted for lifting the disc from the disc spinning chuck.

The disc gripping mechanism preferably includes a housing having a housing member dimensioned to pass through the center opening in the disc and a plurality of disc retainers, such as balls, that are mounted in the housing member and are radially movable with respect to the axis of rotation for engaging the disc at the periphery of the center opening. The disc gripping mechanism preferably further includes a preloading device for urging the disc retainers radially outwardly. The preloading device may comprise a pin that is axially movable along the axis of rotation with respect to the housing, and a spring disposed between the pin and the housing. The pin may include a frustoconical surface that bears against the disc retainers with a preloading force. The pin is accessible externally of the housing to permit compression of the spring and release of the preloading force on the disc retainers.

According to another aspect of the invention, a coating apparatus for coating a disc having a center opening is provided. The coating apparatus comprises a first station for dispensing a quantity of lacquer on a surface of the disc and for spinning the disc to distribute a coating of the lacquer over the disc surface, a second station, and a transfer assembly. The transfer assembly includes a device for loading the disc into the first station and a gripper for transferring the disc from the first station to the second station. The gripper includes a rotatable disc gripping mechanism for clamping the disc during spinning thereof at the first station and for lifting the disc from the first station.

The transfer assembly preferably includes means for moving the gripper between the first station and the second station. The gripper preferably has the gripper configuration described above.

According to a further aspect of the invention, a method for coating a disc having a center opening is provided. The method comprises the steps of placing a disc in a first station, dispensing a quantity of lacquer on a surface of the disc at the first station, clamping the disc to the first station with a gripper having a rotatable disc gripping mechanism, spinning the disc at the first station to distribute a coating of the lacquer over the disc surface, and transferring the disc from the first station to the second station with the gripper.

The step of transferring the disc from the first station to the second station preferably includes lifting the disc from the first station with the gripper, moving the gripper from the first station to the second station and releasing the disc from the gripper onto the second station. The step of releasing the disc preferably includes pressing the gripper against the second station with a force that actuates the gripper and causes the disc to be released from the gripper onto the second station.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
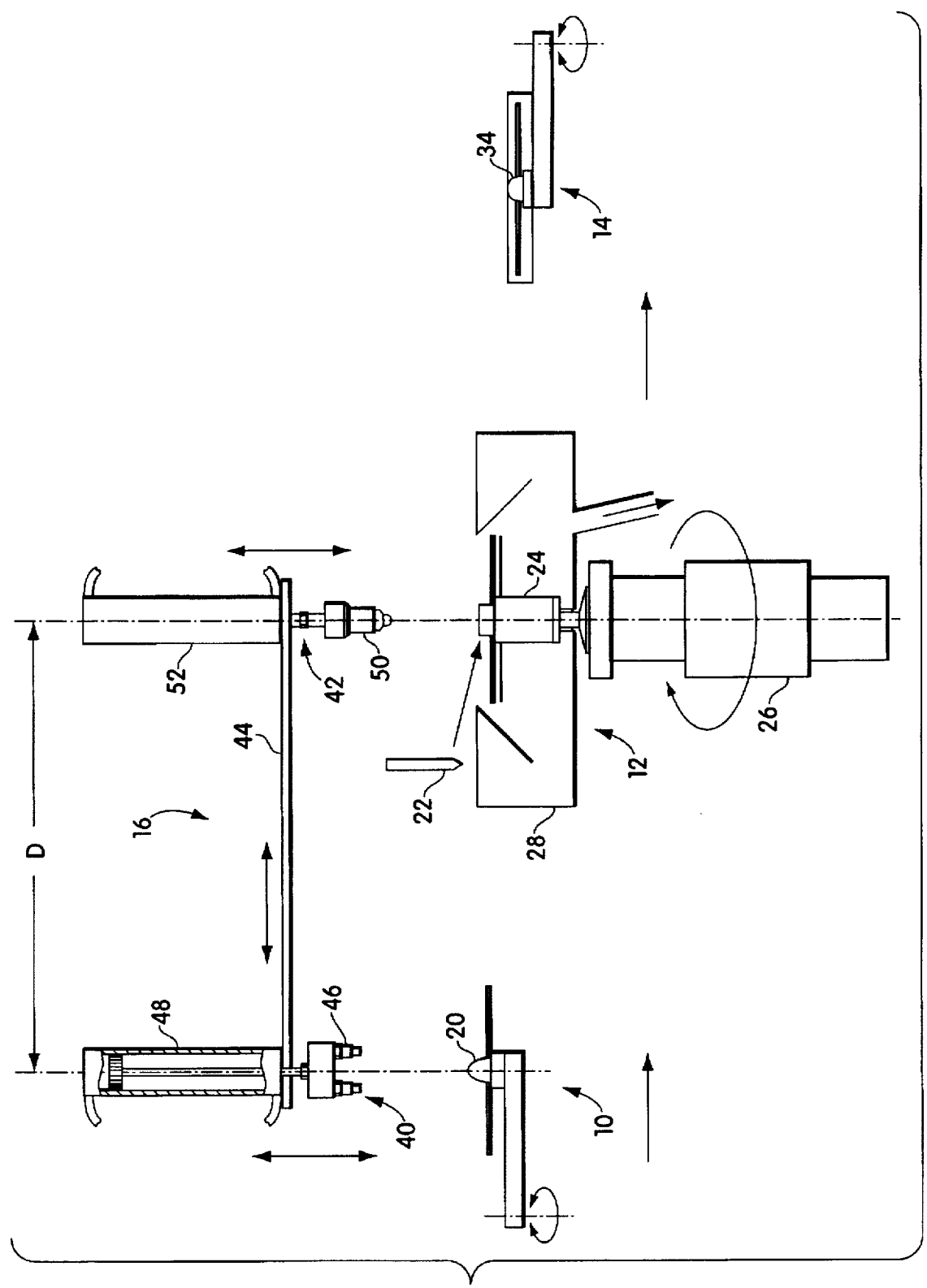
FIG. 1 is a simplified schematic diagram of a disc coating apparatus in accordance with the present invention, with the rotatable disc gripper positioned above the dosing and spinning station.
Figure 2:
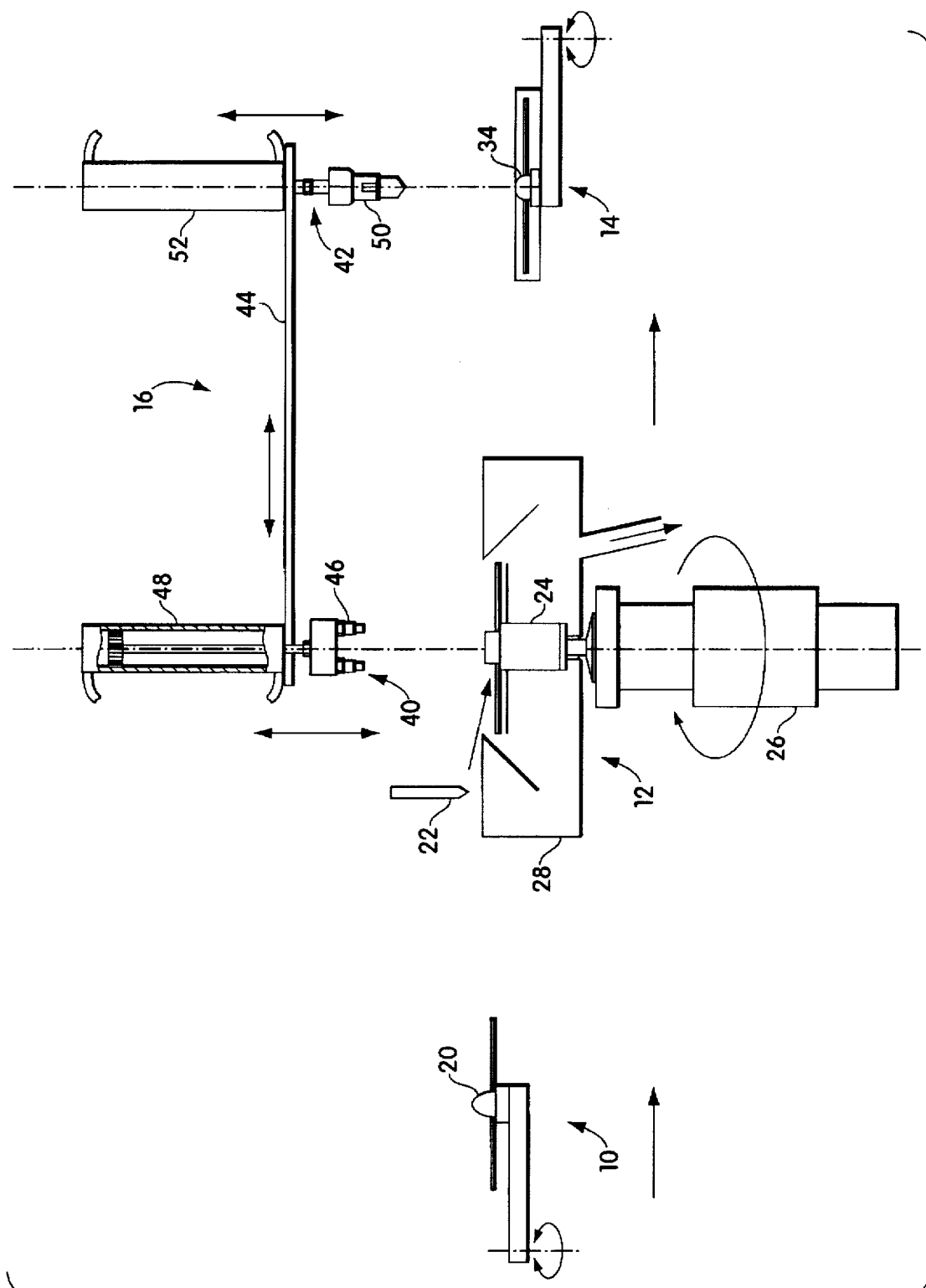
FIG. 2 is a simplified schematic diagram of the disc coating apparatus, with the rotatable disc gripper positioned above the transfer station.

Schematic representations of a compact disc coating apparatus in accordance with the present invention are shown in FIGS. 1 and 2. The apparatus is used for applying a lacquer coating to a metallized compact disc. The coating apparatus includes a centering station 10, a dosing and spinning station 12, a transfer station 14 and a transfer assembly 16. A curing chamber is part of the coating apparatus but is not shown and forms no part of the invention. Although the coating apparatus includes several stations, it is considered a one bowl spincoater because dosing of lacquer and spinning are performed at one process station.

The centering station 10 includes a centering chuck 20 for positioning of metallized discs with respect to the coating system. The dosing and spinning station 12 includes a lacquer dispenser 22, a disc spinning chuck 24, a disc spinning motor 26 and a bowl 28. The bowl 28 prevents spattering of lacquer during the coating process. The transfer station 14 includes a chuck 34 for holding the compact disc during curing of the lacquer coating. Typically, the compact disc is loaded onto the chuck 34, and then the chuck 34 is transferred into a curing chamber for curing of the compact disc.

The transfer assembly 16 includes a pickup head 40 and a gripper 42 mounted to a support frame The pickup head 40 and the gripper 42 are spaced apart by a distance D that is equal to the spacing between the centering station 10 and the dosing and spinning station 12. The transfer station 14 is also spaced from the dosing and spinning station 12 by the distance D. The transfer assembly 16 is linearly movable between a position shown in FIG. 1, where the pickup head 40 is located above centering station 10 and the gripper 42 is located above dosing and spinning station 12, and a position shown in FIG. 2, where the pickup head 40 is located above dosing and spinning station 12 and the gripper 42 is located above transfer station 14.

The pickup head 40 preferably includes a vacuum chuck 46 connected to an air cylinder 48. The air cylinder 48 moves vacuum chuck 46 between a raised position shown in FIGS. 1 and 2, and a lowered position slightly above station 10 or station 12.

The gripper 42 includes a disc gripping mechanism 50 connected to an air cylinder 52. The air cylinder 52 moves the disc gripping mechanism 50 vertically between a raised position as shown in FIGS. 1 and 2 and a lowered position slightly above station 12 or station 14. The construction and operation of the disc gripping mechanism 50 is described in detail below.

In operation, a metallized compact disc 60 is placed on centering station 60 from a previous process station. With the transfer assembly 16 positioned as shown in FIG. 1, the vacuum chuck 46 is lowered by air cylinder 48 and is actuated to pick up the compact disc 60. The transfer assembly 16 then moves linearly to the position shown in FIG. 2, and the vacuum chuck 46 and the compact disc are lowered onto the disc spinning chuck 24 of dosing and spinning station 12. The lacquer dispenser 22 is moved to a position above the compact disc and dispenses a metered quantity of lacquer onto the compact disc near its center opening as the CD is rotated by motor 26 at a speed of about one rpm. At the same time, the transfer assembly 16 returns to the position shown in FIG. 1, and the disc gripping mechanism 50 is lowered by air cylinder 52 into contact with the CD at the dosing and spinning station 12. The disc spinning motor 26 then spins the CD at a rate of about 3500 rpm to 5000 rpm so as to distribute a coating of lacquer over the disc surface by centrifugal force. As described in detail below, the disc gripping mechanism 50 grips the compact disc and spins with it during spinning of the compact disc. It will be understood that rotation rates and times for dosing and spinning are given by way of example only and that the actual values selected depend on a number of factors, as well as the application.

After spinning the CD for approximately two seconds, the motor 26 is deenergized and the CD is lifted by gripper 42 from the dosing and spinning station 12. Because the disc gripping mechanism 50 clamps the CD and rotates with it during spinning, the CD can be lifted by the disc gripping mechanism 50 as soon as the CD stops spinning. It is not necessary to wait until the CD stops spinning and then move a pickup mechanism into contact with it, as in prior art systems. After the CD is lifted by gripping mechanism 50 from dosing and spinning station 12, the transfer assembly 16 is moved linearly to the position shown in FIG. 2, and the disc gripping mechanism 50 and the CD are lowered by air cylinder 52 to the transfer station 14. The disc gripping mechanism 50 contacts the chuck 34, causing the compact disc to be released onto the transfer station 14. The compact disc is then transferred into the curing chamber (not shown) for curing.

Although the operations performed by pickup head 40 and gripper 42 have been described separately, it will be understood that these operations occur simultaneously. Thus, one CD is moved by pickup head 40 from station 10 to station 12 and, simultaneously therewith, another CD is moved by gripper 42 from station 12 to station 14. This operation insures a high rate of throughput.

Figure 3:
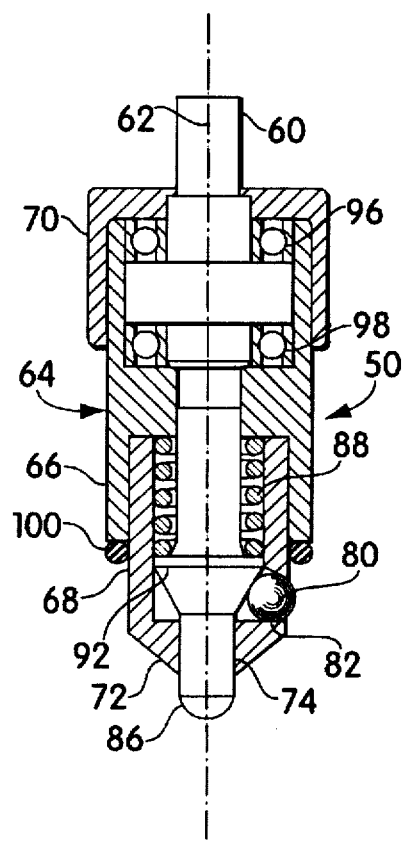
FIG. 3 is a cross-sectional view of the disc gripping mechanism of the present invention.
Figure 4:
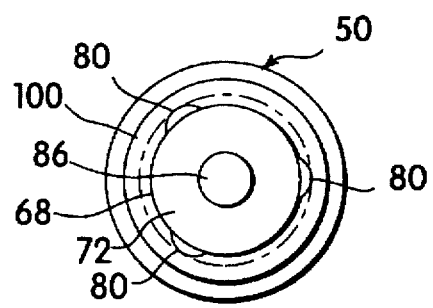
FIG. 4 is an end view of the disc gripping mechanism of FIG. 3.

The details of the disc gripping mechanism 50 are shown in FIGS. 3 and 4. The disc gripping mechanism 50 is connected to a shaft 60 and is mounted for rotation about an axis of rotation 62 with respect to the shaft 60. The shaft 60 connects the disc gripping mechanism 50 to the air cylinder 52. A housing 64 of the disc gripping mechanism 50 includes a generally cylindrical main housing member 66, a disc-engaging housing member 68 and a cap 70. The housing member 68 is retained within a bore at the lower end of main housing member 66 and comprises a generally cylindrical tube that is dimensioned to pass through the center opening in a compact disc. A lower end portion 72 of housing member 68 is tapered inwardly and includes a central aperture 74. The cap 70 covers the upper end of main housing member 66 and has a central aperture for shaft 60.

The disc gripping mechanism 50 further includes a plurality of disc retainers, preferably comprising metal balls 80, that are located within housing member 68. Each of the balls 80 extends partway through an aperture 82 in the cylindrical wall of housing member 68 and is radially movable with respect to axis of rotation 62. The apertures 82 that retain balls 80 are dimensioned such that the balls 80 can extend outwardly from housing member 68 but are retained within housing member 68. In a preferred embodiment, three equally spaced balls having diameters of 5/32 inch are utilized. It will be understood that different ball diameters may be utilized within the scope of the present invention.

The balls 80 are urged outwardly through apertures 82 by a preloading device, including a pin 86 and a spring 88. Spring 88 is positioned in the interior of housing member 68 between main housing member 66 and a rib 92 on pin 86. The spring 88 urges pin 86 downwardly along axis 62. The rib 92 has a frustoconical lower surface that bears against the balls 80 and urges them radially outwardly through apertures 82. The pin 86 extends through aperture 74 in housing member 68 and is accessible externally of the disc gripping mechanism 50. An upward force on pin 86 compresses spring 88 and releases the preloading force on balls 80.

The housing 64 is connected to the shaft 62 by rotary bearings 96 and 98, which permit the disc gripping mechanism 50 to rotate about axis 62 with respect to shaft 60. The rotary bearings are disposed in a bore in the upper portion of main housing member 66. An elastomer ring 100 is mounted at the lower end of main housing member 66 for frictional contact with a compact disc as described below.

The disc spinning and pickup sequence at dosing and spinning station 12 is illustrated in FIGS. 5A–5D. The disc spinning chuck 24 preferably includes a base member 110 connected to motor 26 (FIG. 1) and a cylindrical member 112 affixed to base member 110. An elastomer ring 114 is mounted in a groove in the upper surface of cylindrical member 112. A gripper-engaging member 116 is mounted within cylindrical member 112 for axial movement along spinning axis 120. A spring 122 disposed between base member 110 and gripper-engaging member 116 urges member 116 upwardly along axis 120.

Figure 5D:
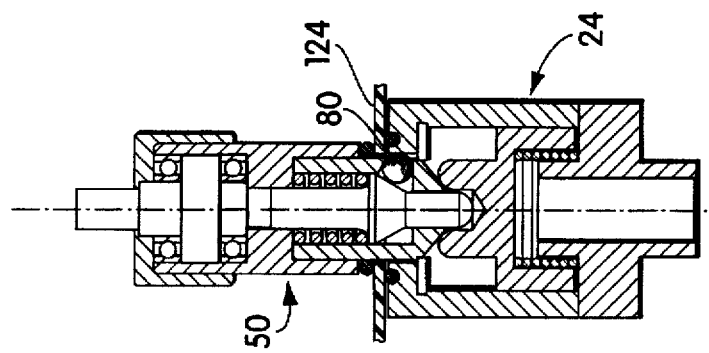
FIGS. 5A–5D illustrate a disc pickup sequence using the disc gripper of the present invention.
Figure 5C:
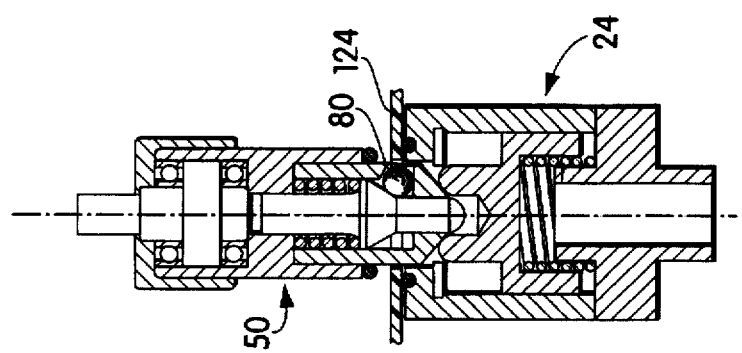
Figure 5B:
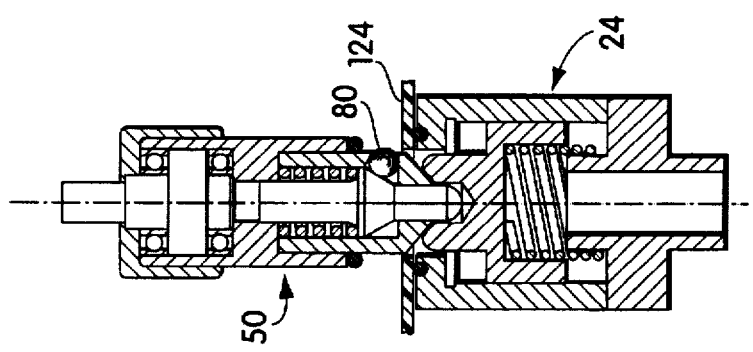
Figure 5A:
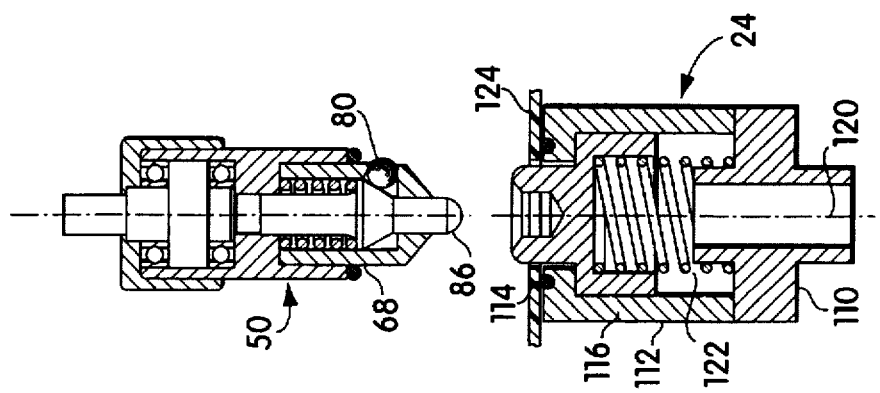
Figure 6A:
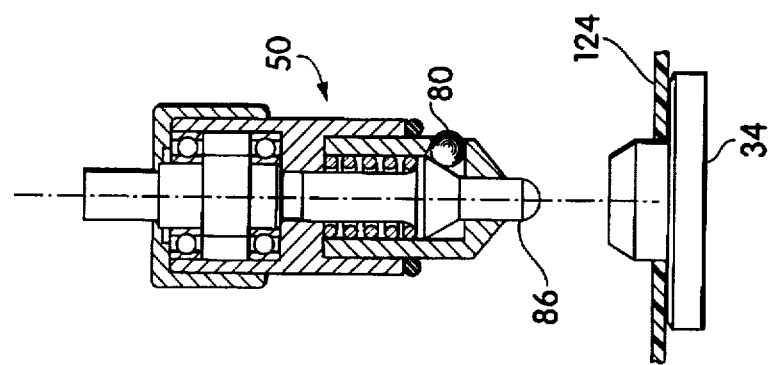
FIGS. 6A–6D illustrate a disc release sequence using the disc gripper of the present invention.

Initially, metallized disc 124 is placed on disc spinning chuck 24 by vacuum chuck 46 as described above in connection with FIG. 2. The disc 124 is spun at a low rate of speed, and a quantity of lacquer is applied to the disc surface near the center opening. The disc gripping mechanism 50 is lowered such that housing member 68 passes through the center opening in disc 124 and moves gripper-engaging member 116 downwardly by compressing spring 122. As the disc gripping mechanism 50 moves downwardly, the balls 80 contact the compact disc 124 (FIG. 5B) and are forced inwardly by the compact disc, causing the pin 86 to move upwardly and the spring 88 to be compressed. The inward movement of balls 80 is illustrated in FIG. 5C. After the balls 80 pass compact disc 124, they are again urged outwardly by the pin 86 and the spring 88, as shown in FIG. 5D. In their outward positions, the balls 80 extend at least slightly beyond the periphery of the center opening in disc 124. This permits the disc to be lifted as illustrated in FIG. 6A.

Compact discs typically have a center opening diameter of 0.591 inch. In a preferred embodiment, the housing member 68 has a diameter of 0.585 inch, and the balls 80 are tangent to a circle having a diameter of 0.645 inch in their outwardly extended positions, as shown in FIG. 4.

As shown in FIG. 5D, the disc 124 is firmly clamped between disc spinning chuck 24 and disc gripping mechanism 50 for spinning. More specifically, the disc 124 is clamped between elastomer rings 100 and 114 and is spun by motor 26 (FIG. 1). During spinning, the disc gripping mechanism 50 is caused to rotate with disc 124 as a result of frictional contact between disc 124 and elastomer ring 100.

Figure 6B:
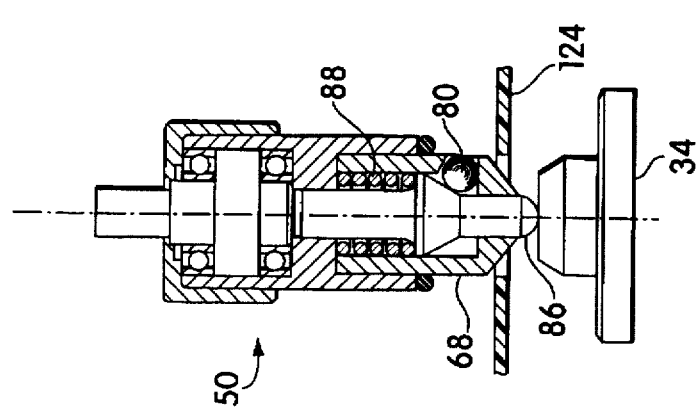
Figure 6C:
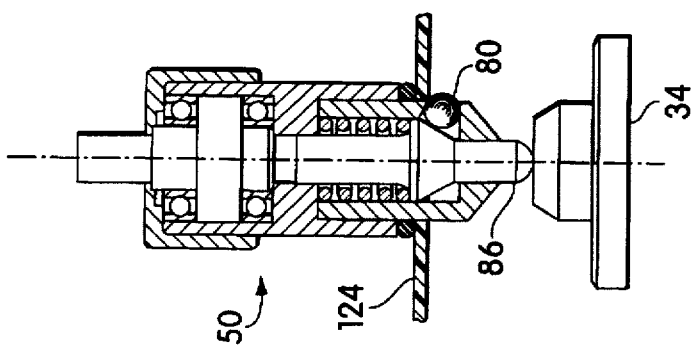
Figure 6D:
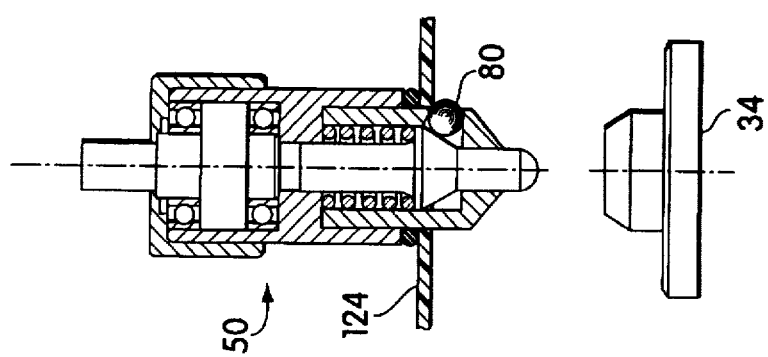

When the disc 124 has been spun for a sufficient time to produce a desired lacquer coating, the motor 26 is deenergized. As soon as the disc 124 stops spinning, it can be lifted from the disc spinning chuck 24. As illustrated in FIG. 6A, the disc 124 is retained on the disc gripping mechanism 50 by balls 80. The disc gripping mechanism 50 is moved by transfer assembly 16 to a position above chuck 34, as illustrated in FIG. 6A. Then, the disc gripping mechanism 50 is moved downwardly by air cylinder 52 (FIG. 2) until pin 86 contacts chuck 34, as illustrated in FIG. 6B. The disc gripping mechanism 50 is moved downwardly by a sufficient distance to force pin 86 upwardly relative to housing member 68 and to compress spring 88, as shown in FIG. 6C. The upward movement of pin 86 releases the outward force on balls 80, permitting them to move radially inwardly. The weight of disc 124 on balls 80 causes them to move inwardly, thus permitting disc 124 to drop onto chuck 34, as illustrated in FIG. 6C. The disc gripping mechanism 50 is then moved upwardly from chuck 34, as illustrated in FIG. 6D. The upward force on pin 86 is removed, and spring 88 causes pin 86 to return to its normal position, with balls 80 being moved radially outwardly to their original positions. At this point, the clamping, lifting, transfer and release sequence by gripper 42 is complete.

The coating apparatus of the present invention is shown in FIGS. 1 and 2 and described above as including pickup head 40 for transferring compact discs to the dosing and spinning station 12. It will be understood that any suitable mechanism can be used for loading compact discs into the dosing and spinning station 12. Examples of other suitable mechanisms include a moving belt and a gripper of the type shown and described herein. In addition, the disc gripping mechanism 50 has been described as clamping the CD to the disc spinning chuck 24 during spinning but not during dosing. However, the disc gripping mechanism 50 can be used to clamp the CD to the disc spinning chuck 24 during both dosing and spinning.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A gripper for manipulating a disc having a center opening, comprising:

a disc gripping mechanism for gripping a disc at its center opening; and an actuator connected to said disc gripping mechanism for linearly moving said disc gripping mechanism along an axis of rotation between a retracted position and an extended position, said disc gripping mechanism being adapted for clamping said disc to a disc spinning chuck and for rotating with said disc during spinning thereof by said disc spinning chuck, said disc gripping mechanism being further adapted for lifting said disc from said disc spinning chuck, said disc gripping mechanism including a housing having a portion dimensioned to pass through the center opening in said disc and a plurality of disc retainers that are mounted in said housing portion and are radially movable with respect to said axis of rotation for engaging said disc at the periphery of said center opening, wherein said disc retainers pass through the center opening in said disc as said disc gripping mechanism is moved from the retracted position to the extended position and wherein said disc retainers engage said disc so that said disc is held on said disc gripping mechanism as said disc is lifted from said disc spinning chuck by said disc gripping mechanism.

2. A gripper as defined in claim 1 wherein said disc retainers comprise balls.

3. A gripper as defined in claim 2 wherein said disc gripping mechanism further includes a preloading device for urging said balls radially outwardly.

4. A gripper as defined in claim 3 wherein said preloading device comprises a pin that is axially movable along said axis of rotation with respect to said housing and includes a frustoconical surface that bears against said balls with a preloading force, and a spring connected between said pin and said housing.

5. A gripper as defined in claim 4 wherein said pin is accessible externally of said housing to permit compression of said spring and release of the preloading force on said balls.

6. A gripper as defined in claim 1 wherein said actuator includes a shaft connected to said disc gripping mechanism and wherein said disc gripping mechanism includes a rotary bearing connected to said shaft for rotary movement of said disc gripping mechanism with respect to said shaft about said axis of rotation.

7. A gripper as defined in claim 1 wherein said actuator comprises an air cylinder.

8. A gripper for manipulating a disc having a center opening, comprising:

a disc gripping mechanism for gripping a disc at its center opening; and an actuator connected to said disc gripping mechanism for linearly moving said disc gripping mechanism along an axis of rotation between a retracted position and an extended position, said disc gripping mechanism being adapted for clamping said disc to a disc spinning chuck and for rotating with said disc during spinning thereof by said disc spinning chuck, said disc gripping mechanism being further adapted for lifting said disc from said disc spinning chuck, said disc gripping mechanism including a housing having a portion dimensioned to pass through the center opening in said disc and a plurality of disc retainers that are mounted in said housing portion and are radially movable with respect to said axis of rotation for engaging said disc at the periphery of said center opening, said disc gripping mechanism further including an elastomer ring attached to said housing for frictional contact with said disc.

9. A coating apparatus for coating a disc having a center opening, comprising:

a first station for dispensing a quantity of lacquer on a surface of the disc and for spinning the disc to distribute a coating of said lacquer over the disc surface;

a second station; and a transfer assembly including a device for loading the disc into said first station and a gripper for transferring said disc from said first station to said second station, said gripper including a rotatable disc gripping mechanism for clamping said disc during spinning thereof at said first station and for lifting said disc from said first station, said gripper further including an actuator connected to said disc gripping mechanism for linearly moving said disc gripping mechanism along an axis of rotation between a retracted position and an extended position, said disc gripping mechanism, being adapted for clamping said disc to a disc spinning chuck at said first station and for rotating with said disc during spinning thereof by said disc spinning chuck.

10. A coating apparatus as defined in claim 9 wherein said transfer assembly includes means for moving said gripper between said first station and said second station.

11. A coating apparatus as defined in claim 10 wherein said disc gripping mechanism includes a housing having a portion dimensioned to pass through the center opening in said disc and a plurality of disc retainers that are mounted in said housing portion and are radially movable with respect to said axis of rotation for engaging said disc at the periphery of said center opening.

12. A coating apparatus as defined in claim 11 wherein said disc retainers comprise balls.

13. A coating apparatus as defined in claim 12 wherein said disc gripping mechanism further includes a preloading device for urging said balls radially outwardly.

14. A coating apparatus as defined in claim 13 wherein said preloading device comprises a pin that is axially movable along said axis of rotation with respect to said housing and includes a frustoconical surface that contacts said balls with a preloading force, and a spring connected between said pin and said housing.

15. A coating apparatus as defined in claim 14 wherein said pin is accessible externally of said housing so that application of an axial force to said pin at said second station causes said spring to be compressed and the preloading force on said balls to be released, whereby said disc is released from disc gripping mechanism onto said second station.

16. A coating apparatus as defined in claim 10 wherein said actuator includes a shaft connected to said disc gripping mechanism and wherein said disc gripping mechanism includes a rotary bearing connected to said shaft for rotary movement of said disc gripping mechanism with respect to said shaft about said axis of rotation.

\* \* \* \* \*